United States Patent
Wu et al.

(10) Patent No.: US 8,698,148 B2
(45) Date of Patent: Apr. 15, 2014

(54) DISPLAY DEVICES AND FABRICATION METHODS THEREOF

(75) Inventors: Rong-Bing Wu, Kaohsiung (TW); Chien-Hao Wu, Tainan (TW); Po-Hsiao Chen, Yunlin (TW)

(73) Assignee: Hannstar Display Corp., New Taipei (TW)

( * ) Notice: Subject to any disclaimer, the term of this patent is extended or adjusted under 35 U.S.C. 154(b) by 245 days.

(21) Appl. No.: 13/420,922

(22) Filed: Mar. 15, 2012

(65) Prior Publication Data
US 2013/0087791 A1    Apr. 11, 2013

(30) Foreign Application Priority Data
Oct. 6, 2011  (TW) ............... 100136235 A (51) Int. Cl.
*H01L 29/786* (2006.01)
*H01L 21/336* (2006.01)

(52) U.S. Cl.
USPC ............... 257/59; 257/E29.273; 257/E21.411

(58) Field of Classification Search
CPC .............. H01L 27/124; H01L 27/1248; H01L 27/1288
USPC ............... 257/59, E29.273–E29.294, 257/E21.411–E21.416; 438/149–160
See application file for complete search history.

(56) References Cited

U.S. PATENT DOCUMENTS 6,992,732 B2 * 1/2006 Kim et al. ............ 349/43

* cited by examiner

*Primary Examiner* — Julio J Maldonado
*Assistant Examiner* — Daniel Shook
(74) *Attorney, Agent, or Firm* — Muncy, Geissler, Olds & Lowe, P.C.

(57) ABSTRACT

A display device and a fabrication method thereof are provided. The display device includes a first metal layer disposed on a display area and a peripheral area. An insulating layer covers the first metal layer. A patterned semiconductor layer is disposed on the insulating layer at the display area. A second metal layer is disposed on the patterned semiconductor layer and the insulating layer at the peripheral area. A transparent conductive layer directly covers the second metal layer. A protective layer completely covers the second metal layer, the patterned semiconductor layer and the transparent conductive layer. The protective layer includes a first portion, a second portion and a through hole, wherein the first portion has a height which is higher than a height of the second portion.

24 Claims, 10 Drawing Sheets

DISPLAY DEVICES AND FABRICATION METHODS THEREOF

CROSS REFERENCE TO RELATED APPLICATIONS

This application claims priority of Taiwan Patent Application No. 100136235, filed on Oct. 6, 2011, the entirety of which is incorporated by reference herein.

BACKGROUND OF THE INVENTION

1. Field of the Invention

The invention relates to a display device, and more particularly to an array substrate of a display device and a fabrication method thereof.

2. Description of the Related Art

Figure 1:
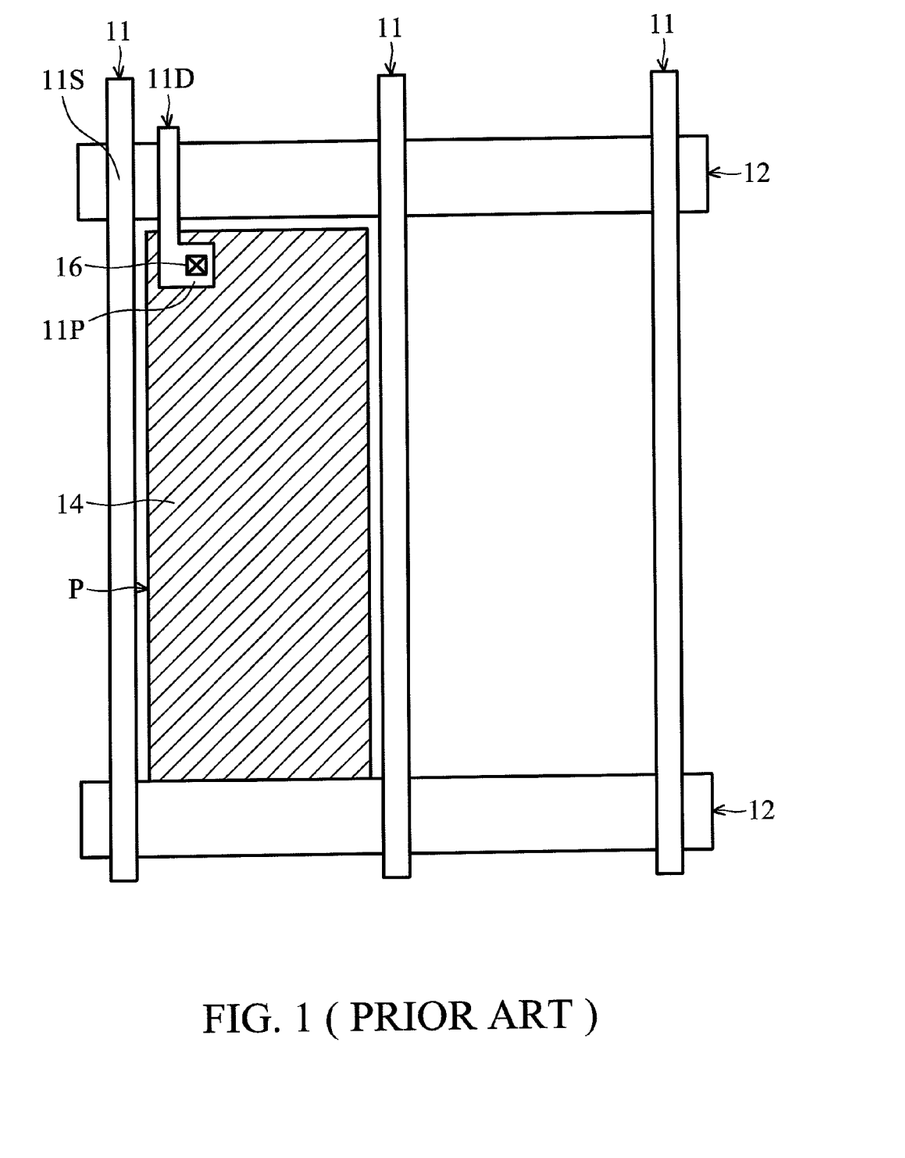
FIG. 1 shows a schematic partial top view of an array substrate of a conventional liquid crystal display.

Referring to FIG. 1, a partial top view of an array substrate of a conventional liquid crystal display is shown. Gate lines 12 are formed from a metal layer, data lines 11, a source electrode 11S and a drain electrode 11D are formed from another metal layer. A pixel electrode 14 is formed in a pixel area P defined by any two adjacent gate lines 12 and any two adjacent data lines 11. A passivation layer (not shown) is disposed between the metal layer of the data lines 11, the source electrode 11 S and the drain electrode 11D and the pixel electrode 14. A contact hole 16 is formed in the passivation layer over the drain electrode 11D and the contact hole 16 is filled with the pixel electrode 14 for electrically connecting the drain electrode 11D to the pixel electrode 14.

The drain electrode 11D needs to have a protrudent metal pattern 11P disposed in the pixel area P for disposing the contact hole 16 thereon. However, an aperture ratio of the conventional liquid crystal display is reduced by the protrudent metal pattern 11P of the drain electrode 11D.

Also, in a peripheral area of the array substrate of the conventional liquid crystal display, the metal layer of the gate lines 12 needs to electrically connect to the other metal layer of the data lines 11, the source electrode 11S and the drain electrode 11D, according to the circuit design of the liquid crystal display. There is no overlap between the two metal layers in the peripheral area of the array substrate of the conventional liquid crystal display. Thus, a plurality of contact holes in an insulating layer and the passivation layer over the two metal layers needs to be formed to expose the two metal layers respectively and a transparent electrode material of the pixel electrode 14 is used to fill the plurality of contact holes for electrically connecting the two metal layers at the peripheral area. However, the transparent electrode material of the pixel electrode 14 has a high resistance. Therefore, the resistance of the circuit at the peripheral area of the conventional liquid crystal display is increased.

Moreover, the conventional liquid crystal display includes a color filter (CF) substrate disposed opposite to the array substrate. A plurality of spacers needs to be disposed between the CF substrate and the array substrate for controlling a distance between the two substrates. Generally, the spacers of the conventional liquid crystal display are formed from a photosensitive material on the CF substrate, which is referred to as a spacer on CF (SOC). Therefore, the fabrication of the conventional liquid crystal displays needs a mask and an exposure and a development process to form the SOC.

BRIEF SUMMARY OF THE INVENTION

Embodiments of the invention provide a display device and a fabrication method thereof. A contact hole in a pixel area of a display area of the display devices does not need to be formed. Thus, a metal pattern for disposing a contact hole thereon in the pixel area of the display area of the display devices does not need to be formed. Therefore, the problems of the conventional liquid crystal displays are overcome. An aperture ratio of the display devices of the invention is enhanced. A resistance of a circuit at a peripheral area of an array substrate of the display devices of the invention is reduced. Moreover, fabrication steps of the display devices of the invention are decreased and a fabrication cost of the display devices of the invention is also reduced.

An embodiment of the invention provides a display device. The display device having a display area and a peripheral area surrounding the display area, comprises a first metal layer disposed at the display area and the peripheral area. An insulating layer is disposed at the display area and the peripheral area to cover the first metal layer. A patterned semiconductor layer is disposed on the insulating layer at the display area. A second metal layer is disposed on the patterned semiconductor layer and the insulating layer at the peripheral area. A transparent conductive layer directly covers the second metal layer at the display area and a protective layer completely covers the second metal layer, the patterned semiconductor layer and the transparent conductive layer, wherein the protective layer includes a first portion, a second portion and a through hole, and the first portion has a height which is higher than a height of the second portion.

Further, an embodiment of the invention provides a method for fabricating a display device. The display device has a display area and a peripheral area surrounding the display area. The method comprises: forming a first metal layer at the display area and the peripheral area; forming an insulating layer at the display area and the peripheral area to cover the first metal layer; forming a patterned semiconductor layer on the insulating layer at the display area; forming a second metal layer on the patterned semiconductor layer and the insulating layer at the peripheral area; forming a transparent conductive layer directly covering the second metal layer at the display area; and forming a protective layer completely covering the second metal layer, the patterned semiconductor layer and the transparent conductive layer, wherein the protective layer includes a first portion, a second portion and a through hole, and the first portion has a height which is higher than a height of the second portion.

A detailed description is given in the following embodiments with reference to the accompanying drawings.

BRIEF DESCRIPTION OF THE DRAWINGS

The invention can be more fully understood by reading the subsequent detailed description and examples with reference to the accompanying drawings, wherein.

DETAILED DESCRIPTION OF THE INVENTION

The following description is of the best-contemplated mode of carrying out the invention. The description is provided for illustrating the general principles of the invention and is not meant to be limiting. The scope of the invention is best determined by reference to the appended claims.

Figure 2:
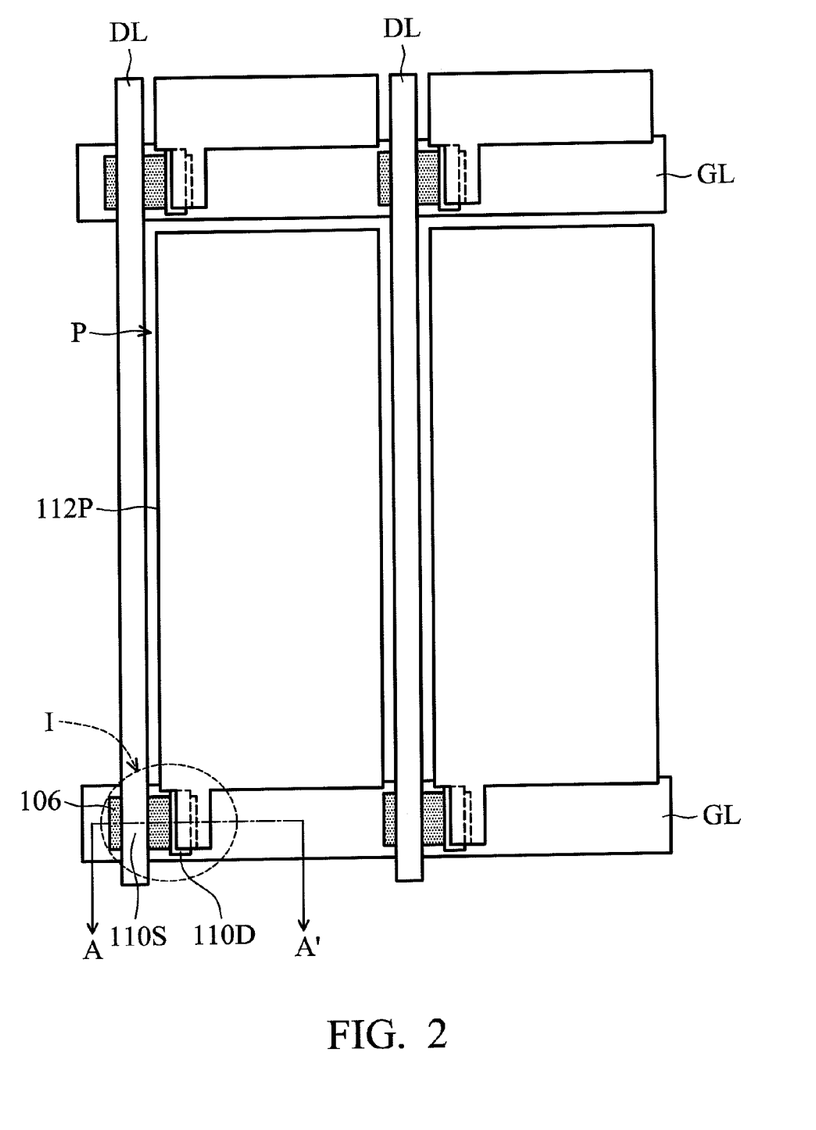
FIG. 2 shows a schematic partial top view of an array substrate of a display device according to an embodiment of the invention.

Referring to FIG. 2, a partial top view of an array substrate of a display device according to an embodiment of the invention is shown. A thin-film transistor (TFT) I shown in FIG. 2 is an I-type device, which includes a gate electrode (not shown), an insulating layer (not shown), a patterned semiconductor layer 106, a source electrode 110S and a drain electrode 110D. As shown in FIG. 2, a pixel area P is defined by two adjacent gate lines GL and two data lines DL. The gate electrode (not shown), and the gate lines GL are formed from a first metal layer 102 (referring to FIG. 3). The data lines DL, the source electrode 110S and the drain electrode 110D are formed from a second metal layer 110 (referring to FIG. 3). A pixel electrode 112P is formed from a transparent conductive layer 112 (referring to FIG. 3). The pixel electrode 112P is disposed in the pixel area P and extends over the drain electrode 110D. There is no passivation layer disposed between the pixel electrode 112P and the drain electrode 110D, such that the pixel electrode 112P directly covers the drain electrode 110D for producing an electrical connection between the pixel electrode 112P and the drain electrode 110D. Therefore, according to the embodiment of the invention, a contact hole does not need to be formed over the drain electrode 110D and an extra pattern of the drain electrode 10D in the pixel area P for disposing a contact hole thereon does not need to be formed. Thus, the drain electrode 110D does not occupy the pixel area P and the aperture ratio of the display device is increased.

Figure 3:
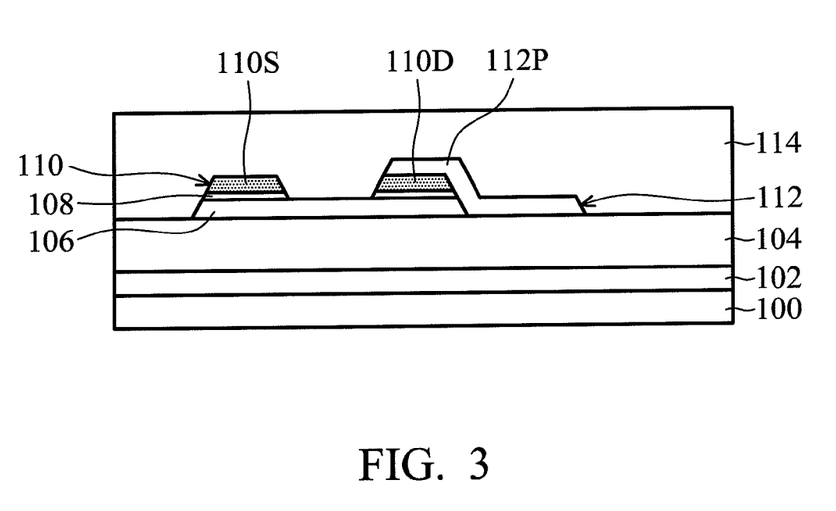
FIG. 3 shows a schematic partial cross section of an array substrate along a cross section line A-A' of FIG. 2 according to an embodiment of the invention.

Referring to FIG. 3, a partial cross section of an array substrate along a cross section line A-A' of FIG. 2 according to an embodiment of the invention is shown. The first metal layer 102 for forming the gate electrode and the gate lines GL is formed on a first substrate 100. An insulating layer 104 is formed on the first metal layer 102. The patterned semiconductor layer 106 is formed on the insulating layer 104. The patterned semiconductor layer 106 is for example amorphous silicon (a-Si). The source electrode 110S and the drain electrode 110D are formed on the patterned semiconductor layer 106. Moreover, an ohmic contact layer 108 is formed between the source electrode 110S, the drain electrode 110D and the patterned semiconductor layer 106. The ohmic contact layer 108 may be an N-typed heavy doped silicon ($N^+$-Si). The transparent conductive layer 112 for forming the pixel electrode 112P directly covers the drain electrode 110D. The pixel electrode 112P partially overlaps the patterned semiconductor layer 106. A protective layer 114 completely covers the source electrode 110S, the drain electrode 110D, the patterned semiconductor layer 106, the pixel electrode 112P and the insulating layer 104.

Figure 4:
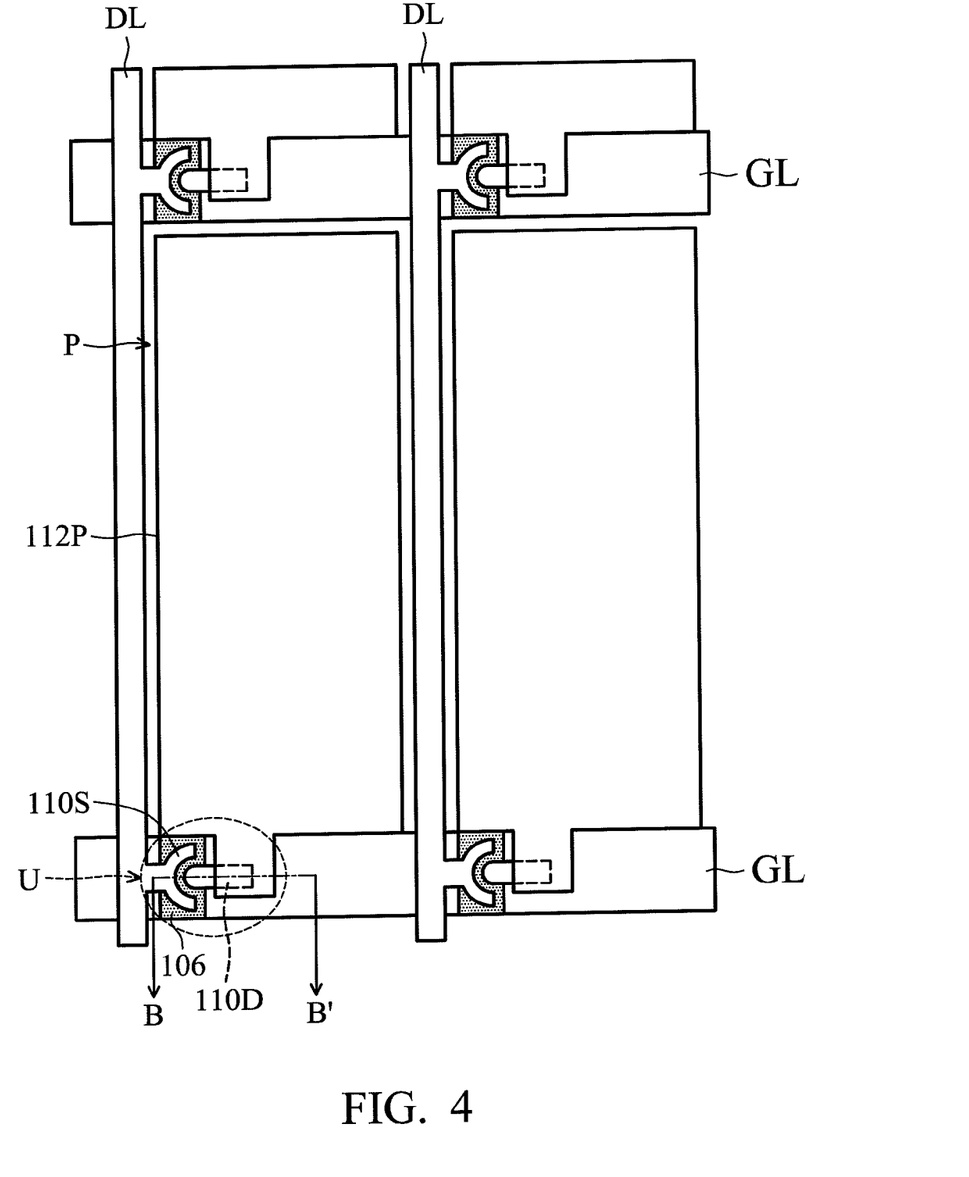
FIG. 4 shows a schematic partial top view of an array substrate of a display device according to another embodiment of the invention.

Referring to FIG. 4, a partial top view of an array substrate of a display device according to another embodiment of the invention is shown. A thin-film transistor (TFT) U shown in FIG. 4 is a U-type device, which includes a gate electrode (not shown), an insulating layer (not shown), a patterned semiconductor layer 106, a source electrode 110S and a drain electrode 110D. As shown in FIG. 4, a pixel area P is defined by two adjacent gate lines GL and two data lines DL. The gate electrode (not shown), and the gate lines GL are formed from a first metal layer 102 (referring to FIG. 5). The data lines DL, the source electrode 110S and the drain electrode 110D are formed from a second metal layer 110 (referring to FIG. 5). A pixel electrode 112P is formed from a transparent conductive layer 112 (referring to FIG. 5). The pixel electrode 112P is disposed in the pixel area P and extends over the drain electrode 110D. There is no passivation layer disposed between the pixel electrode 112P and the drain electrode 110D, such that the pixel electrode 112P directly covers a portion of the drain electrode 110D for producing an electrical connection between the pixel electrode 112P and the drain electrode 110D. Therefore, according to the embodiment of the invention, a contact hole is not required to be formed over the drain electrode 110D and an extra pattern of the drain electrode 110D in the pixel area P for disposing a contact hole thereon is not required to be formed. Thus, the drain electrode 110D does not occupy the pixel area P and the aperture ratio of the display device is increased.

Figure 5:
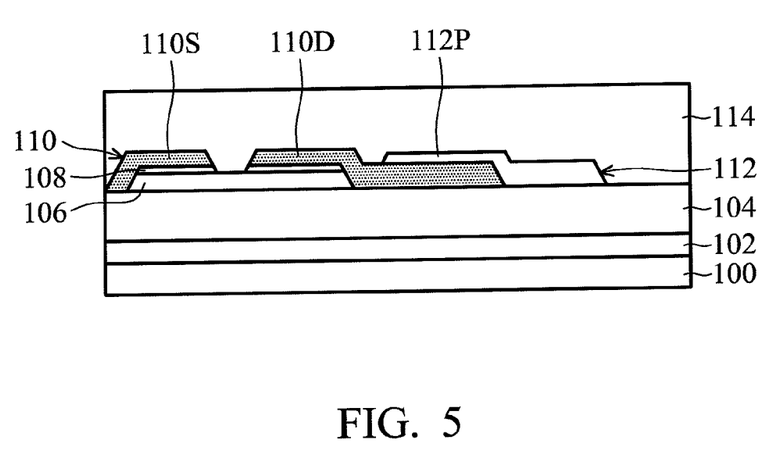
FIG. 5 shows a schematic partial cross section of an array substrate along a cross section line B-B' of FIG. 4 according to an embodiment of the invention.

Referring to FIG. 5, a partial cross section of an array substrate along a cross section line B-B' of FIG. 4 according to an embodiment of the invention is shown. The first metal layer 102 for forming the gate electrode and the gate lines GL is formed on a first substrate 100. An insulating layer 104 is formed on the first metal layer 102. The patterned semiconductor layer 106 is formed on the insulating layer 104. The second metal layer 110 for forming the source electrode 110S and the drain electrode 110D is formed on the patterned semiconductor layer 106. Moreover, an ohmic contact layer 108 is formed between the source electrode 110S, the drain electrode 110D and the patterned semiconductor layer 106. The transparent conductive layer 112 for forming the pixel electrode 112P directly covers a portion of the drain electrode 110D. The pixel electrode 112P does not overlap with the patterned semiconductor layer 106. A protective layer 114 completely covers the source electrode 110S, the drain electrode 110D, the patterned semiconductor layer 106, the pixel electrode 112P and the insulating layer 104.

Referring to FIGS. 6A-6J, partial cross sections of various intermediate stages of fabricating a display device according to an embodiment of the invention are shown. The thin-film transistor (TFT) shown in FIGS. 6A-6J is a U-type device, but the other type thin-film transistors. For example, an I-type device, can also be fabricated by the fabrication method of the embodiment. FIGS. 6A-6J show a display area 100A and a peripheral area 100B of the display device, wherein the peripheral area 100B surrounds the display area 100A. One TFT is shown in the display area 100A to simplify the description. The display area 100A actually contains a plurality of TFTs and a plurality of pixel areas P, wherein one TFT is disposed in an opaque area of the display area 100A, not in the pixel area P. A peripheral circuit of the display device is disposed in the peripheral area 100B.

Figure 6A:
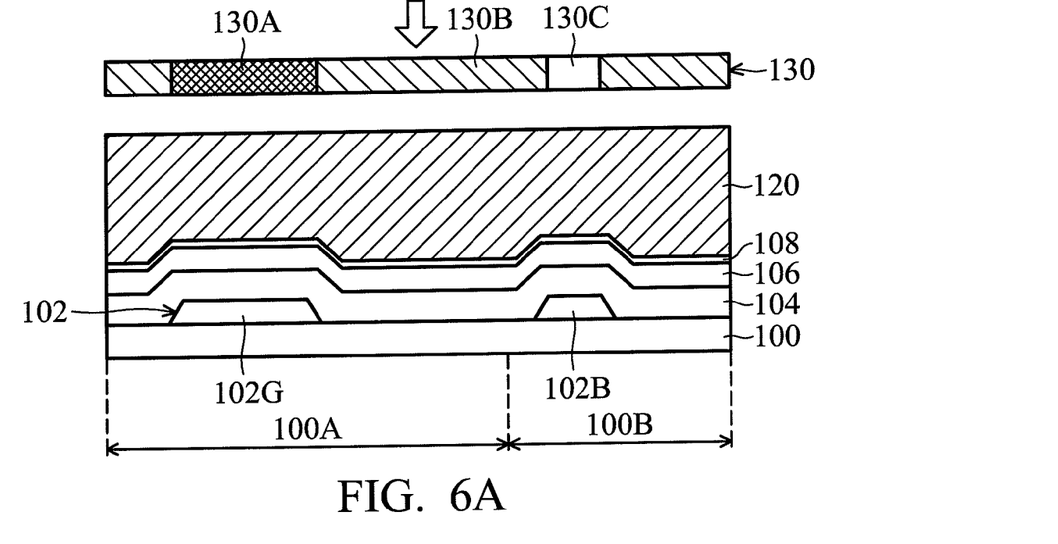
FIGS. 6A-6J show schematic partial cross sections of various intermediate stages of fabricating a display device according to an embodiment of the invention.

Referring to FIG. 6A, firstly, a first substrate 100 is provided for a substrate of the array substrate. A first metal layer 102 is deposited on the first substrate 100. Then, the first metal layer 102 is patterned by a photolithography and an etching process to form a gate electrode 102G, and gate lines (not shown) at the display area 100A and simultaneously form a peripheral circuit 102B at the peripheral area 100B. Next, an insulating layer 104 is formed on the first metal layer 102. Then, a semiconductor layer 106, an ohmic contact layer 108 and a first photoresist layer 120 are formed on the insulating layer 104 in sequence.

A halftone mask 130 is provided to be disposed over the first photoresist layer 120. The halftone mask 130 may be a gray photomask, a halftone photomask or a photomask having a plurality of slit-shaped patterns. The halftone mask 130 has an opaque pattern 130A with a light transmission rate of about 0%, a semiopaque pattern 130B with a light transmission rate of about 50% and a transparent pattern 130C with a light transmission rate of about 100%. Using the halftone mask 130 to perform an exposure and a development process to the first photoresist layer 120 can form the patterned first photoresist layer 120 as shown in FIG. 6B.

The patterned first photoresist layer 120 includes a first portion 122 formed on a TFT device area of the display area 100A, i.e. the first portion 122 is formed over the gate electrode 102G. The patterned first photoresist layer 120 further includes a second portion 124 formed on an area of the display area 100A and the peripheral area 100B other than the TFT device area. The patterned first photoresist layer 120 further includes a through hole 126 formed over the peripheral circuit 102B formed of the first metal layer 102 at the peripheral area 100B. The first portion 122 corresponds to the opaque pattern 130A, the second portion 124 corresponds to the semiopaque pattern 130B and the through hole 126 corresponds to the transparent pattern 130C. Therefore, the first portion 122 has a height which is higher than a height of the second portion 124 and no first photoresist layer 120 remains in the through hole 126.

Figure 6B:
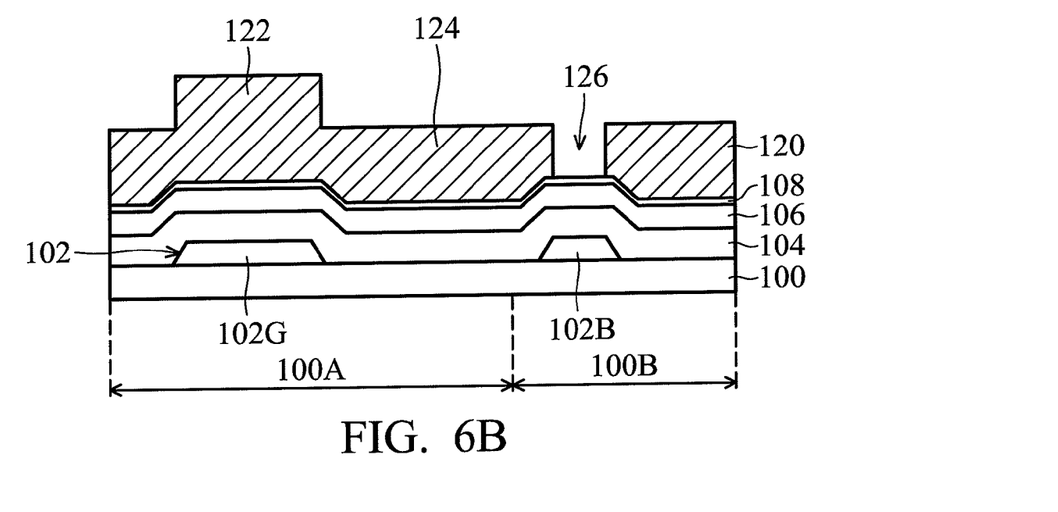
Figure 6C:
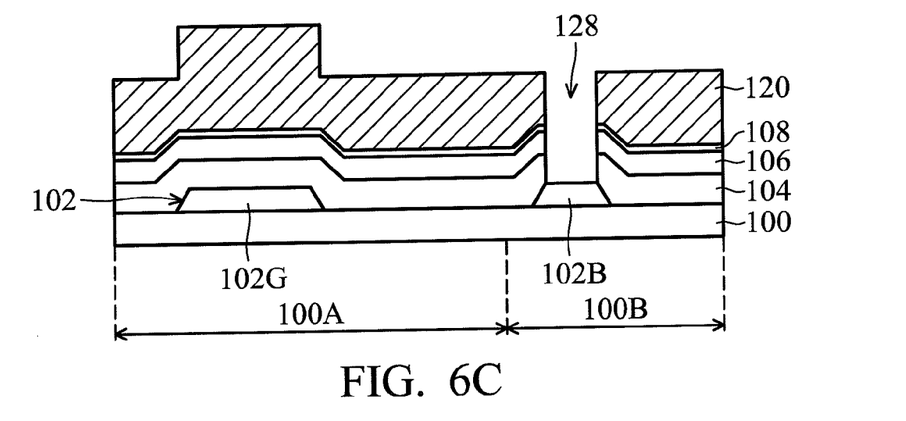

Referring to FIG. 6C, the patterned first photoresist layer 120 is used as a mask to perform an etching process to the insulating layer 104, the semiconductor layer 106 and the ohmic contact layer 108 at the peripheral area 100B through the through hole 126 (as shown in FIG. 6B) to form an opening 128. Thus, the peripheral circuit 102B formed of the first metal layer 102 at the peripheral area 100B is exposed through the opening 128.

Figure 6D:
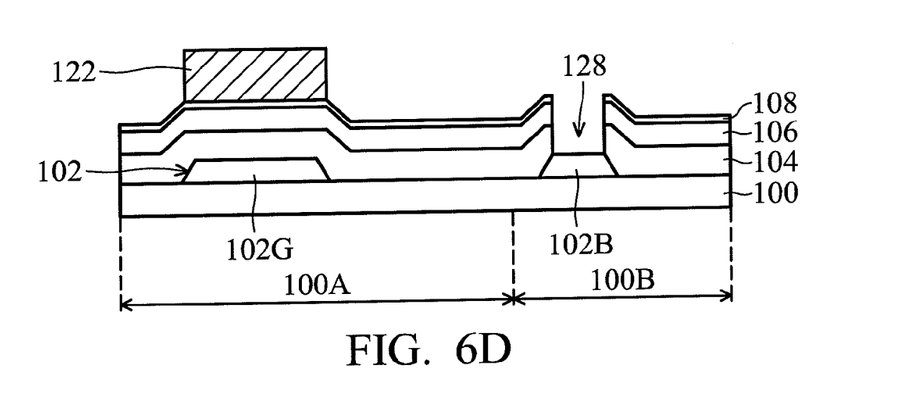

The second portion 124 of the patterned first photoresist layer 120 can be removed by an $O_2$ asher. After the second portion 124 is completely removed, the height of the first portion 122 is also reduced as shown in FIG. 6D.

Figure 6E:
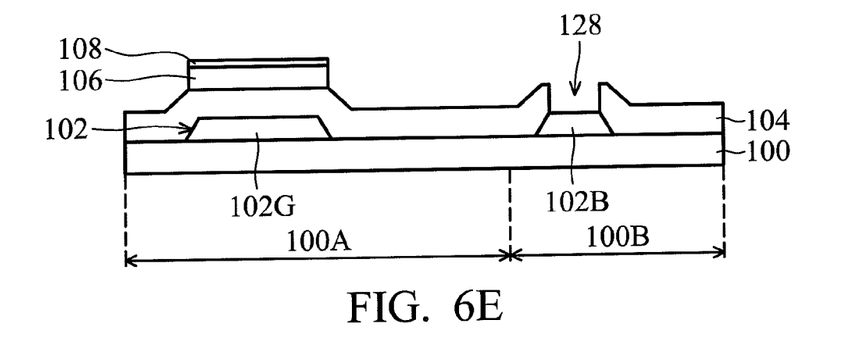

The remaining first portion 122 of the patterned first photoresist layer 120 is used as mask to perform an etching process to the semiconductor layer 106 and the ohmic contact layer 108. A patterned semiconductor layer 106 and a patterned ohmic contact layer 108 are formed at the display area 100A. Then, the remaining first portion 122 is removed as shown in FIG. 6E.

Figure 6F:
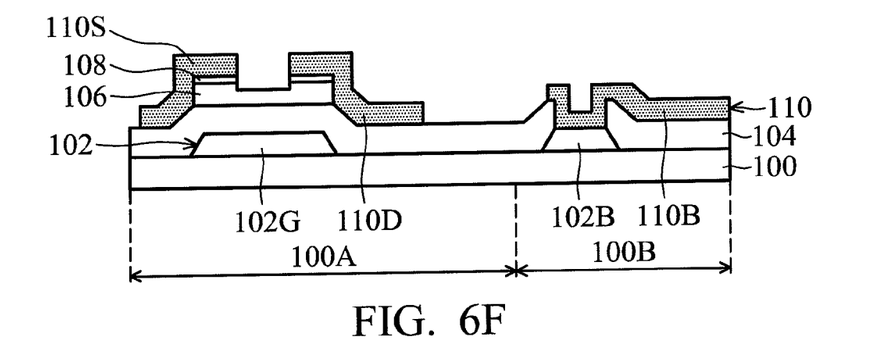

Referring to FIG. 6F, a second metal layer 110 is deposited over the first substrate 100. Then, the second metal layer 110 is patterned by a photolithography and an etching process to form the source electrode 110S, the drain electrode 110D and the data lines (not shown) at the display area 100A and simultaneously form a peripheral circuit 110B at the peripheral area 100B. Meanwhile, a portion of the ohmic contact layer 108 and a portion of the patterned semiconductor layer 106 between the source electrode 110S and the drain electrode 110D are removed by an etching process.

Figure 6G:
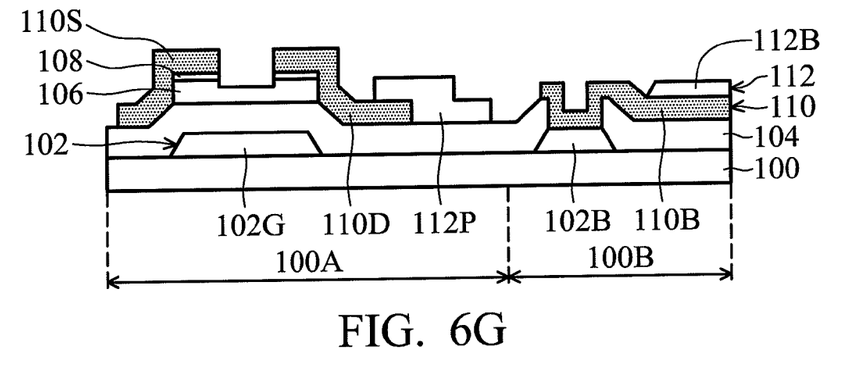

Referring to FIG. 6G, a transparent conductive layer 112 is deposited over the first substrate 100. Then, the transparent conductive layer 112 is patterned by a photolithography and an etching process to form a pixel electrode 112P at the display area 100A and simultaneously form a transparent conductive pattern 112B at the peripheral area 100B. The pixel electrode 112P directly covers a portion of the drain electrode 110D. The transparent conductive pattern 112B directly covers the peripheral circuit 110B formed of the second metal layer 110. In another embodiment, the material of the second metal layer 110 is a non-active metal material, thus the transparent conductive pattern 112B does not have to be formed on the peripheral circuit 110B to protect the peripheral circuit 110B.

Figure 6H:
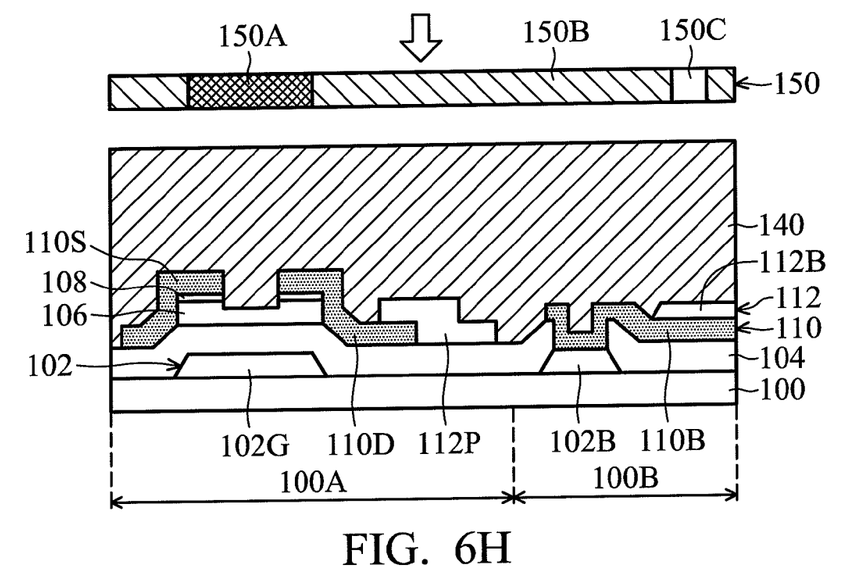
Figure 6I:
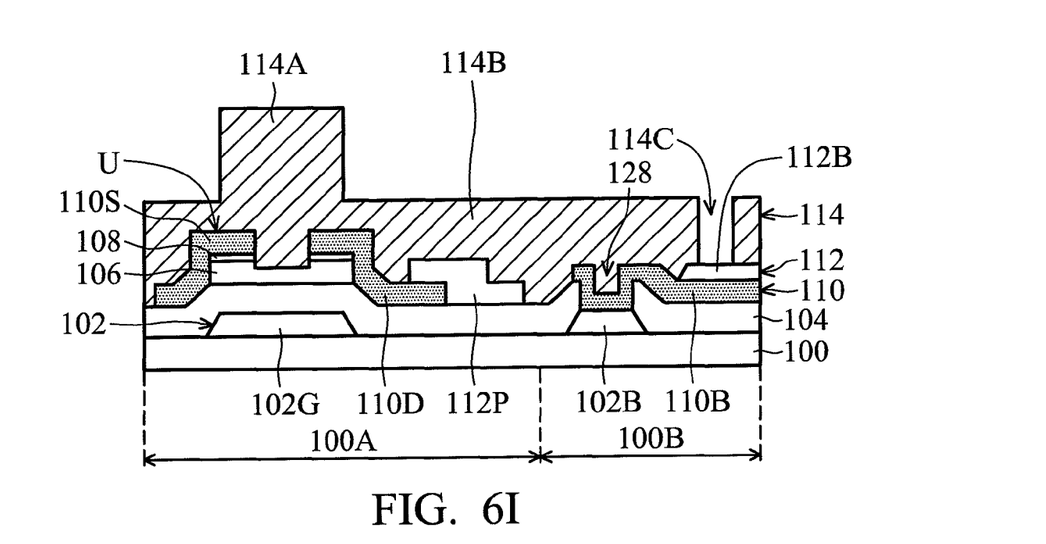

Referring to FIG. 6H, a second photoresist layer 140 is coated over the first substrate 100. The material of the second photoresist layer 140 is an insulating photosensitive material. A halftone mask 150 is provided to be disposed over the second photoresist layer 140. The halftone mask 150 has an opaque pattern 150A with a light transmission rate of about 0%, a semiopaque pattern 150B with a light transmission rate of about 50% and a transparent pattern 150C with a light transmission rate of about 100%. Using the halftone mask 150 to perform an exposure and a development process to the second photoresist layer 140 can form the protective layer 114 as shown in FIG. 6I.

The protective layer 114 includes a first portion 114A formed on an opaque area of the display area 100A other than the pixel area P. For example, an area above the TFT device U, an area above the gate lines GL or the data line DL as shown in FIG. 2 and FIG. 4 or an area corresponding to the location of a black matrix (BM). The protective layer 114 further includes a through hole 114C formed over the transparent conductive pattern 112B at the peripheral area 100B. The transparent conductive pattern 112B is exposed by the through hole 114C. In another embodiment, the material of the second metal layer 110 is a non-active metal material, thus the transparent conductive pattern 112B is not required to be formed on the peripheral circuit 110B to protect the peripheral circuit 110B. In the embodiment, a portion of the peripheral circuit 110B at the peripheral area 100B is exposed by the through hole 114C. Moreover, the protective layer 114 further includes a second portion 114B formed on an area of the display area 100A and the peripheral area 100B other than the areas of the first portion 114A and the through hole 114C. The first portion 114A corresponds to the opaque pattern 150A, the second portion 114B corresponds to the semiopaque pattern 150B and the through hole 114C corresponds to the transparent pattern 150C. Thus, the first portion 114A has a height which is higher than a height of the second portion 114B.

Figure 6J:
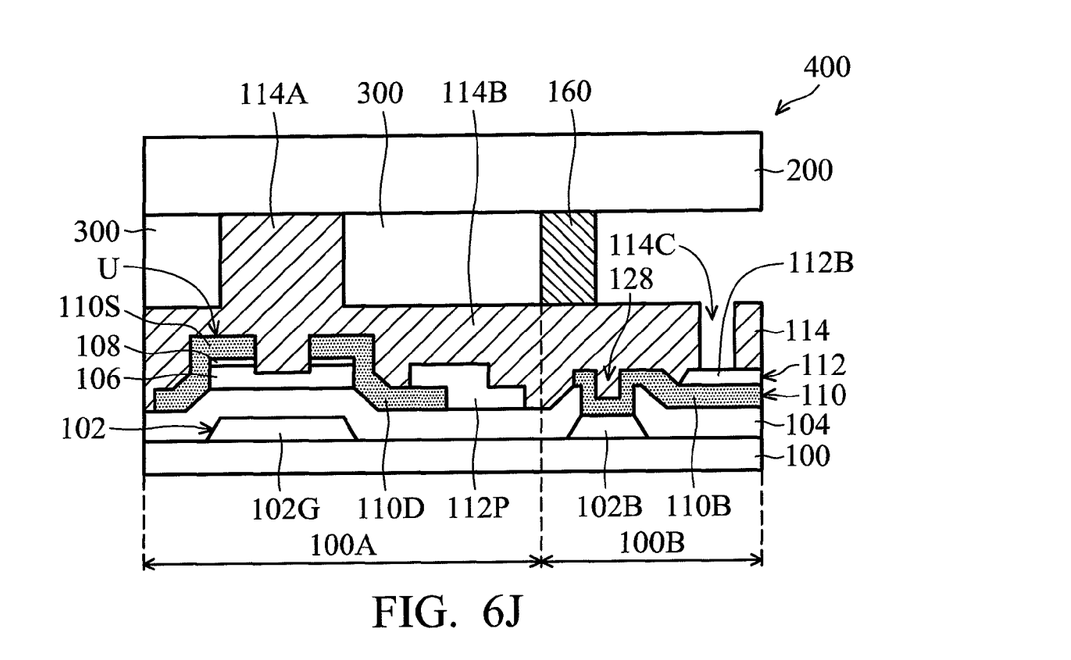

Referring to FIG. 6J, a second substrate 200 is provided to be disposed opposite to the first substrate 100. The second substrate 200 is for example a color filter substrate. A display medium layer 300, for example, a liquid crystal layer, is provided to be filled between the first substrate 100 and the second substrate 200. A sealant 160 is disposed at the peripheral area 100B to seal the display medium layer 300 to complete the fabrication of the display device 400.

As shown in FIG. 6J, the first portion 114A of the protective layer 114 can be used as a spacer between the first substrate 100 and the second substrate 200. The first portion 114A of the protective layer 114 is referred to as a spacer on array substrate (SOA) to support the second substrate 200. The second portion 114B of the protective layer 114 can protect all elements on the first substrate 100. The transparent conductive pattern 112B or the peripheral circuit 110B at the peripheral area 100B is exposed by the through hole 114C of the protective layer 114. Thus, an external circuit of the display device 400 is electrically connected to the peripheral circuit 110B at the peripheral area 100B through the through hole 114C. When the material of the second metal layer 110 is an active metal material, the transparent conductive pattern 112B can protect the peripheral circuit 110B formed of the second metal layer 110 to prevent the peripheral circuit 110B from corroding.

Moreover, the peripheral circuit 110B formed of the second metal layer 110 at the peripheral area 100B directly contacts the peripheral circuit 102B formed of the first metal layer 102 through the opening 128 of the insulating layer 104 to produce an electrical connection. Thus, the electrical signal of the external circuit is conveyed to the display device 400 through the electrical connection between the peripheral circuit 110B and the peripheral circuit 102B for displaying images.

According to the embodiments of the invention, no passivation layer is disposed between the drain electrode 110D formed of the second metal layer 110 and the pixel electrode 112P formed of the transparent conductive layer 112. Thus, the pixel electrode 112P directly contacts the drain electrode 110D to produce an electrical connection therebetween. Therefore, compared with the drain electrode of the conventional liquid crystal display panel, the drain electrode 110D of the embodiments of the invention does not require formation of an extra pattern in the pixel area P for disposing a contact hole. Thus, the aperture ratio of the display device 400 is enhanced. Meanwhile, compared with the fabrication of the conventional liquid crystal display panel, the embodiments of the invention can omit a deposition process of forming a passivation layer and an etching process of forming a contact hole in the passivation layer.

Moreover, according to the embodiments of the invention, the peripheral circuit 110B formed of the second metal layer 110 at the peripheral area 100B directly contacts the peripheral circuit 102B formed of the first metal layer 102 through the opening 128 of the insulating layer 104 to produce an electrical connection therebetween. However, the conventional liquid crystal display panel requires a transparent electrode material to be used to electrically connect a first metal layer with a second metal layer at a peripheral area through respective contact holes of the first metal layer and the second metal layer to form a peripheral circuit. The transparent electrode material used in the conventional liquid crystal display panel has a resistance higher than a resistance of a metal material. Thus, the peripheral circuit at the peripheral area 100B of the embodiments of the invention has a resistance lower than a resistance of the peripheral circuit of the conventional liquid crystal display panel and the power consumption of the display device of the embodiment of the invention is also reduced.

Meanwhile, according to the embodiments of the invention, the opening 128 of the insulating layer 104 at the peripheral area 100B is formed by using the halftone mask 130 to perform an exposure and a development process to the first photoresist layer 120 and then the patterned first photoresist layer 120 is used as a mask to etch the insulating layer 104. Thus, the amount of photomasks used in the fabrication of the display device of the embodiment is not increased by the forming step of the opening 128.

Moreover, according to the embodiments of the invention, the protective layer 114 is formed by using the halftone mask 150 to perform an exposure and a development process to the second photoresist layer 140. The first portion 114A of the protective layer 114 is used for a spacer of the display device, and the second portion 114B of the protective layer 114 is used for protecting all elements on the array substrate. Compared with the conventional liquid crystal display panel, the embodiment of the invention does not require an extra photomask and an extra exposure and a development process to form a spacer. According to the embodiments of the invention, the spacer and the protective layer are formed at the same time. Therefore, the embodiments of the invention can save one step for forming the spacer and the fabrication cost of the display devices of the embodiments is also reduced.

In summary, according to the embodiments of the invention, the aperture ratio of the display device is enhanced and the resistance of the peripheral circuit of the display device is also reduced. Further, the fabrication steps of the display device are also decreased, such that the fabrication cost thereof is reduced.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A display device, having a display area and a peripheral area surrounding the display area, the display device comprising:
   a first metal layer disposed at the display area and the peripheral area;
   an insulating layer disposed at the display area and the peripheral area to cover the first metal layer;
   a patterned semiconductor layer disposed on the insulating layer at the display area;
   a second metal layer disposed on the patterned semiconductor layer and the insulating layer at the peripheral area;
   a transparent conductive layer directly covering the second metal layer at the display area; and
   a protective layer completely covering the second metal layer, the patterned semiconductor layer and the transparent conductive layer, wherein the protective layer includes a first portion, a second portion and a through hole, and the first portion has a height which is higher than a height of the second portion.

2. The display device as claimed in claim 1, wherein no contact hole is disposed over the second metal layer located on the patterned semiconductor layer and the second metal layer is not disposed at a pixel area of the display area.

3. The display device as claimed in claim 1, wherein the insulating layer located at the peripheral area has an opening to expose the first metal layer, and the second metal layer located at the peripheral area directly contacts the first metal layer through the opening.

4. The display device as claimed in claim 1, further comprising:
   a first substrate disposed under the first metal layer;
   a second substrate disposed opposite to the first substrate; and
   a display medium layer disposed between the first substrate and the second substrate.

5. The display device as claimed in claim 4, wherein the first portion of the protective layer is a spacer disposed at an opaque area of the display area to support the second substrate.

6. The display device as claimed in claim 1, wherein the through hole of the protective layer is disposed at the peripheral area to expose the second metal layer at the peripheral area.

7. The display device as claimed in claim 1, wherein the transparent conductive layer further comprises a portion directly covering the second metal layer at the peripheral area.

8. The display device as claimed in claim 7, wherein the through hole of the protective layer is disposed at the peripheral area to expose the portion of the transparent conductive layer at the peripheral area.

9. The display device as claimed in claim 1, wherein the material of the protective layer comprises an insulating photosensitive material.

10. The display device as claimed in claim 1, wherein the transparent conductive layer partially overlaps the patterned semiconductor layer.

11. The display device as claimed in claim 1, wherein the transparent conductive layer does not overlap with the patterned semiconductor layer.

12. A method for fabricating a display device, wherein the display device has a display area and a peripheral area surrounding the display area, the method comprising:
    forming a first metal layer at the display area and the peripheral area;
    forming an insulating layer at the display area and the peripheral area to cover the first metal layer;
    forming a patterned semiconductor layer on the insulating layer at the display area;
    forming a second metal layer on the patterned semiconductor layer and the insulating layer at the peripheral area;
    forming a transparent conductive layer directly covering the second metal layer at the display area; and
    forming a protective layer completely covering the second metal layer, the patterned semiconductor layer and the transparent conductive layer, wherein the protective layer includes a first portion, a second portion and a through hole, and the first portion has a height which is higher than a height of the second portion.

13. The method as claimed in claim 12, wherein no contact hole is formed over the second metal layer located on the patterned semiconductor layer and the second metal layer is not formed at a pixel area of the display area.

14. The method as claimed in claim 12, wherein the step of forming the patterned semiconductor layer comprises:
    forming a semiconductor layer at the display area and the peripheral area to cover the insulating layer;
    coating a first photoresist layer at the display area and the peripheral area to cover the semiconductor layer;
    providing a first halftone mask to perform an exposure and a development process to the first photoresist layer to form a patterned photoresist layer, wherein the patterned photoresist layer includes a first portion, a second portion and a through hole, the first portion of the patterned photoresist layer has a height which is higher than a height of the second portion of the patterned photoresist layer, and the through hole of the patterned photoresist layer is formed over the first metal layer at the peripheral area;
    removing the second portion of the patterned photoresist layer to remain the first portion of the patterned photoresist layer;
    using the first portion of the patterned photoresist layer for a mask to etch the semiconductor layer; and
    removing the first portion of the patterned photoresist layer to form the patterned semiconductor layer.

15. The method as claimed in claim 14, wherein the first halftone mask has an opaque pattern, a semiopaque pattern and a transparent pattern, and the opaque pattern corresponds to the first portion of the patterned photoresist layer, the semiopaque pattern corresponds to the second portion of the patterned photoresist layer and the transparent pattern corresponds to the through hole of the patterned photoresist layer.

16. The method as claimed in claim 14, further comprising etching the semiconductor layer and the insulating layer at the peripheral area through the through hole of the patterned photoresist layer to form an opening in the semiconductor layer, wherein the insulating layer and the first metal later at the peripheral area is exposed by the opening.

17. The method as claimed in claim 16, after forming the patterned semiconductor layer, further comprising filling the opening of the insulating layer with the second metal layer formed on the insulating layer at the peripheral area, wherein the second metal layer in the opening directly contacts the first metal layer at the peripheral area.

18. The method as claimed in claim 12, wherein the step of forming the protective layer comprises:
    coating a second photoresist layer at the display area and the peripheral area to cover the second metal layer, the patterned semiconductor layer and the transparent conductive layer; and
    providing a second halftone mask to perform an exposure and a development process to the second photoresist layer to form the protective layer.

19. The method as claimed in claim 18, wherein the second halftone mask has an opaque pattern, a semiopaque pattern and a transparent pattern, and the opaque pattern corresponds to the first portion of the protective layer, the semiopaque pattern corresponds to the second portion of the protective layer and the transparent pattern corresponds to the through hole of the protective layer.

20. The method as claimed in claim 12, further comprising:
    providing a first substrate, wherein the first metal layer is formed on the first metal layer;
    providing a second substrate opposite to the first substrate and facing the protective layer; and
    providing a display medium layer which fills between the first substrate and the second substrate.

21. The method as claimed in claim 20, wherein the first portion of the protective layer is a spacer to support the second substrate and the first portion of the protective layer is formed at an opaque area of the display area.

22. The method as claimed in claim 12, wherein the transparent conductive layer further comprises a portion directly covering the second metal layer at the peripheral area.

23. The method as claimed in claim 22, wherein the through hole of the protective layer is formed at the peripheral area to expose the portion of the transparent conductive layer at the peripheral area.

24. The method as claimed in claim 12, wherein the through hole of the protective layer is formed at the peripheral area to expose the second metal layer at the peripheral area.

* * * * *